US012794429B2

(12) United States Patent
de Andrade et al.

(10) Patent No.: US 12,794,429 B2
(45) Date of Patent: Nov. 10, 2026

(54) FREQUENCY SELECTOR FOR SUPERCONDUCTING PARAMETRIC AMPLIFIERS

(71) Applicant: The United States of America as represented by the Secretary of the Navy, San Diego, CA (US)

(72) Inventors: Marcio de Andrade, San Diego, CA (US); Kyle Sundqvist, Fayetteville, AR (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 308 days.

(21) Appl. No.: 18/793,027

(22) Filed: Aug. 2, 2024

(65) Prior Publication Data

US 2026/0039266 A1 Feb. 5, 2026

(51) Int. Cl.
*H03F 19/00* (2006.01)
*H03F 7/00* (2006.01)

(52) U.S. Cl.
CPC ............... *H03F 19/00* (2013.01); *H03F 7/00* (2013.01)

(58) Field of Classification Search
CPC .................................. H03F 19/00; H03F 7/00
See application file for complete search history.

(56) References Cited

U.S. PATENT DOCUMENTS 10,291,227 B2 5/2019 Abdo
10,680,567 B2 * 6/2020 Uzawa .................... H03F 19/00
12,626,176 B2 * 5/2026 Harris .................... G06N 10/40

(Continued)

FOREIGN PATENT DOCUMENTS

JP 2023511014 A * 3/2023 ............ G06N 10/40

OTHER PUBLICATIONS

C. Macklin et al. ,A near-quantum-limited Josephson traveling-wave parametric amplifier.Science350,307-310(2015). DOI:10.1126/science.aaa8525.

(Continued)

*Primary Examiner* — Adam D Houston
(74) *Attorney, Agent, or Firm* — Naval Information Warfare Center Pacific; Evan Hastings; Kyle Eppele

(57) ABSTRACT

A frequency selector for superconducting parametric amplifiers. According to illustrative embodiments, a frequency selector system for superconducting parametric amplifiers may comprise a Josephson traveling wave parametric amplifier (JTWPA) for producing entangled photon pairs at signal frequency and idler frequency, a resonator electrically connected to the JTWPA for tuning the signal frequency and idler frequency to an application frequency, and an inverse diplexer electrically connected to the resonator for separating the signal frequency and the idler frequency. In some embodiments, a frequency selector system for superconducting parametric amplifiers, comprising a Josephson traveling wave parametric amplifier (JTWPA) for producing entangled photon pairs at signal frequency and idler frequency; a resonator electrically connected to the JTWPA for tuning the signal frequency and idler frequency to an application frequency; and a multiplexer electrically connected to the resonator for separating the signal frequency and the idler frequency.

11 Claims, 4 Drawing Sheets

(56) References Cited

U.S. PATENT DOCUMENTS

| | | | | |
|---|---|---|---|---|
| 2020/0350880 | A1* | 11/2020 | Miano | H03F 7/02 |
| 2025/0233568 | A1* | 7/2025 | Sharafiev | H03F 19/00 |
| 2026/0039266 | A1* | 2/2026 | De Andrade | H03F 7/00 |
| 2026/0170384 | A1* | 6/2026 | Crowe | G06N 10/40 |

OTHER PUBLICATIONS

Roy, Ananda and Devoret, Michel, Introduction to parametric amplification of quantum signals with Josephson circuits, vol. 17, Aug. 2016, pp. 740-755, Comptes Rendus. Physique, Cellule MathDoc/Centre Mersenne, ISSN 1878-1535, http://dx.doi.org/10.1016/j.crhy.2016.07.012, 10.1016/j.crhy.2016.07.012.

J. Aumentado, "Superconducting Parametric Amplifiers: The State of the Art in Josephson Parametric Amplifiers," in IEEE Microwave Magazine, vol. 21, No. 8, pp. 45-59, Aug. 2020, doi: 10.1109/MMM.2020.2993476. keywords: {Qubit;Superconducting microwave devices;Resonant frequency;Photonics;Superconducting device noise;Quantum computing;HEMTs}.

T. C. White and J. Y. Mutus and I.-C. Hoi and R. Barends and B. Campbell and Yu Chen and Z. Chen and B. Chiaro and A. Dunsworth and E. Jeffrey and J. Kelly and A. Megrant and C. Neill and P. J. J. O'Malley and P. Roushan and D. Sank and A. Vainsencher and J. Wenner and S. Chaudhuri and J. Gao and John M. Martinis, Traveling wave parametric amplifier with Josephson junctions using minimal resonator phase matching}, 2015, 1503.04364.

* cited by examiner

FREQUENCY SELECTOR FOR SUPERCONDUCTING PARAMETRIC AMPLIFIERS

STATEMENT REGARDING FEDERALLY-SPONSORED RESEARCH AND DEVELOPMENT

The United States Government has ownership rights in this invention. Licensing inquiries may be directed to Office of Research and Technical Applications Naval Information Warfare Center Pacific, Code 72120, San Diego, CA, 92152; telephone (619) 553-5118; email: NIWC_Pacific_T2@us.navy.mil, referencing Navy Case No. 211,107.

FIELD OF USE

The present invention relates to quantum information technology, and, more specifically, superconducting parametric amplifiers employed to measure qubit states. In one embodiment, selectively tuning and separating photon pairs for superconducting parametric amplifies.

BACKGROUND

In quantum computing, superconducting microelectronic circuits are used to detect low energy microwave signals corresponding with a qubit state. To manipulate a qubit state, microwave signals are scattered by a superconducting resonator. Then, the phase shift in the scattered signal encodes the qubit's state information. Detecting the qubit's state information is challenging because the power with which one can probe is exceptionally small. Exceptional low-noise, single-photon amplifiers, therefore, are essential to enable detection and accurately infer the qubit state.

To address this problem, a Josephson Traveling Wave Parametric Amplifier (JTWPA), as shown in FIG. 1, are utilized in this space to amplify signals with a series of Josephson junctions linearly placed on a transmission line. FIG. 1 shows an illustration of a Josephson Traveling Wave Parametric Amplifiers as a nonlinear lumped-element transmission line. By cycling power between the signal frequency and a corresponding idler frequency, qubit state information may be amplified. The main advantage of JTWPA device when compared to more common Josephson parametric amplifiers (JPA) is higher gain, increased dynamic range, higher frequency bandwidth (typically gigahertz), and increased output flux of entangled pairs at the output. However, the output of a JTWPA are entangled photons pairs where no distinction can be made between the signal and idler particles, aside from their frequency relation. Additionally, the tunability of the signal and idler frequencies are limited by the internal waveguide. There is a need for increased tunability and selectivity in superconducting parametric amplification technology to enable additional quantum applications.

SUMMARY

According to illustrative embodiments, a frequency selector system for superconducting parametric amplifiers may a Josephson traveling wave parametric amplifier (JTWPA) for producing entangled photon pairs at signal frequency and idler frequency; a resonator electrically connected to the JTWPA for tuning the signal frequency and idler frequency to an application frequency; and an inverse diplexer electrically connected to the resonator for separating the signal frequency and the idler frequency.

In some embodiments, a frequency selector system for superconducting parametric amplifiers, comprising a Josephson traveling wave parametric amplifier (JTWPA) for producing entangled photon pairs at signal frequency and idler frequency; a resonator electrically connected to the JTWPA for tuning the signal frequency and idler frequency to an application frequency; and a multiplexer electrically connected to the resonator for separating the signal frequency and the idler frequency.

In some embodiments, a frequency selector apparatus for superconducting parametric amplifiers, comprising: Josephson traveling wave parametric amplifier (JTWPA) for producing entangled photon pairs at signal frequency and idler frequency; a resonator electrically connected to the JTWPA for tuning the signal frequency and idler frequency to an application frequency; and an inverse diplexer electrically connected to the resonator for separating the signal frequency and the idler frequency.

It is an object to provide a frequency selector for superconducting parametric amplifiers that offers numerous benefits, including tuning the output frequencies and separating photons of superconducting parametric amplifiers.

It is an object to overcome the limitations of the prior art.

These, as well as other components, steps, features, objects, benefits, and advantages, will now become clear from a review of the following detailed description of illustrative embodiments, the accompanying drawings, and the claims.

BRIEF DESCRIPTION OF THE DRAWINGS

The accompanying drawings, which are incorporated in and form a part of the specification, illustrate example embodiments and, together with the description, serve to explain the principles of the invention. Throughout the several views, like elements are referenced using like references. The elements in the figures are not drawn to scale and some dimensions are exaggerated for clarity. In the drawings.

DETAILED DESCRIPTION OF EMBODIMENTS

Figure 1:
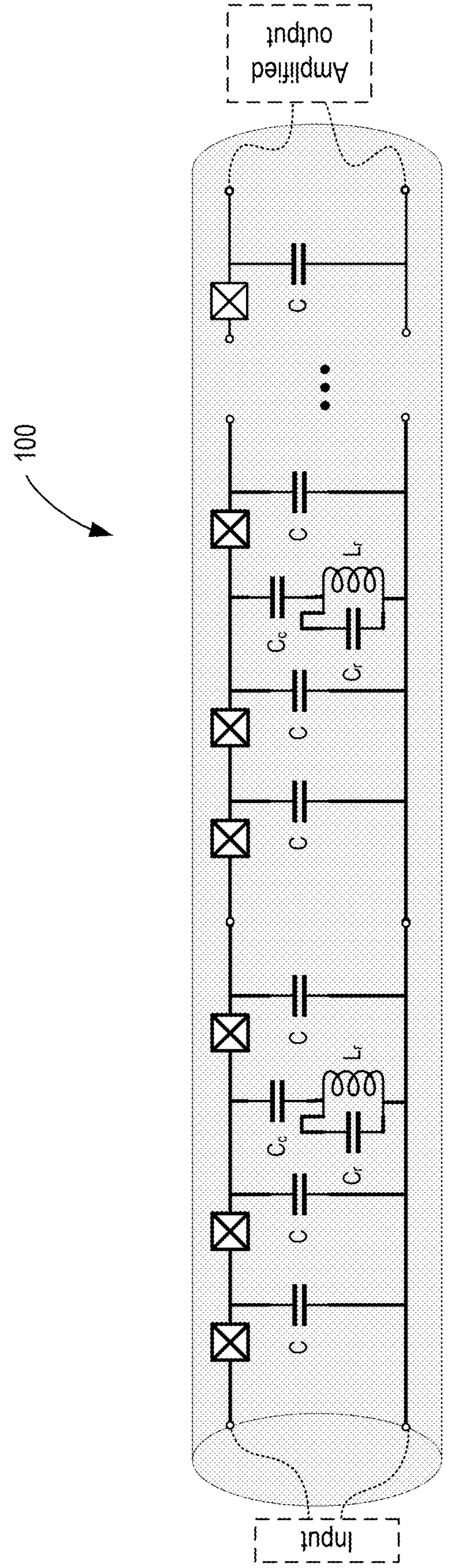
Fig. 1 (prior art)
FIG. 1 (prior art) is an illustration of a Josephson Traveling Wave Parametric Amplifier.

The disclosed apparatus and system below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other apparatus and system described herein as will be understood by one of ordinary skill in the art unless otherwise stated specifically.

References in the present disclosure to "one embodiment," "an embodiment," or any variation thereof, means that a particular element, feature, structure, or characteristic described in connection with the embodiments is included in at least one embodiment. The appearances of the phrases "in one embodiment," "in some embodiments," and "in other embodiments" in various places in the present disclosure are not necessarily all referring to the same embodiment or the same set of embodiments.

As used herein, the terms "comprises," "comprising," "includes," "including," "has," "having," or any variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of words such as "the," "a," or "an" are employed to describe elements and components of the embodiments herein; this is done merely for grammatical reasons and to conform to idiomatic English. This detailed description should be read to include one or at least one, and the singular also includes the plural unless it is clearly indicated otherwise. Superconducting parametric amplification is a topic of great interest to the quantum computing community for its ability to amplify qubit state information. In this space, the Josephson parametric amplifier has been an important tool for high fidelity state measurements in superconducting qubits because it allows parametric amplification with near quantum-limited noise. However, there was further room for improvement on gain and bandwidth. Recently, traveling wave parametric amplifiers, which allow more bandwidth and power saturation, have been combined with Josephson junctions to provide high gain, dynamic range, and high bandwidth super parametric amplification.

A Josephson traveling-wave parametric amplifier (JTWPA) is a nonlinear lumped element transmission line comprising a long chain of Josephson junctions. Signals sent through the JTWPA are amplified by modulation in the Josephson inductance by the injection of a strong pump tone. The input signal is then amplified by cycling power between the signal frequency and a corresponding idler frequency at frequency. As a result, the JTWPA can achieve power gain such as, but not limited to, gains larger than 20 dB over a 3-GHz bandwidth. This performance enables new capabilities for quantum optical devices at microwave frequencies.

To understand an architecture of a JWPTA, an example is provided as follows, but this disclosure is not so limited. One JTWPA unit cell may consist consists of a Josephson junction with critical current $I_0$=4.6 μA and intrinsic capacitance $C_J$=55 $f_F$ with a capacitive shunt to ground C=45 $f_F$. Furthermore, every third unit cell may include a lumped-element resonator designed with capacitance $C_r$=6 pF and inductance $L_r$=120 pH, with coupling strength set by a capacitor $C_c$=20 $f_F$. The value of C in the resonator-loaded cell is reduced to compensate for the addition of $C_c$. This exemplary architecture enables a JTWPA robustly achieves high gain over a bandwidth of several gigahertz with sufficient dynamic range to read out 20 superconducting qubits.

Figure 2:
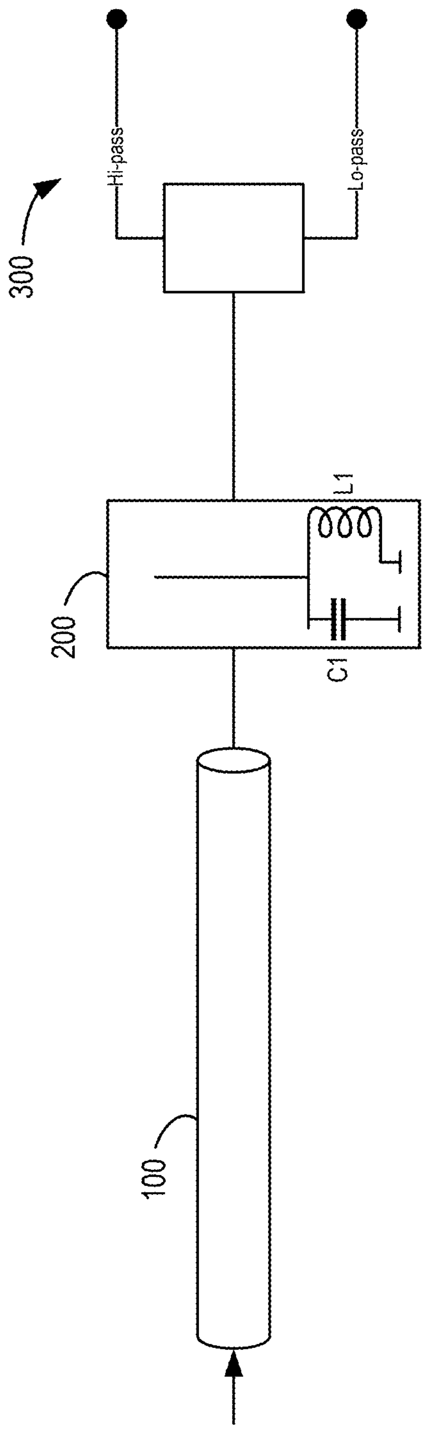
FIG. 2 is an illustration of one embodiment of a frequency selector for superconducting parametric amplifiers comprising an inverse diplexer.

FIG. 2 is an illustration of one embodiment of a frequency selector for superconducting parametric amplifiers comprising a JTWPA 100 in series with a resonator 200, and an inverse diplexer 300. Traveling wave parametric amplifiers, including JTWPAs 100, permit frequency selection by choosing an input pumping frequency. The output is an entangled pair of photons at signal frequency ($\omega_s$) and idler frequency ($\omega_i$). However, the produced entangled pair are indistinguishable between the signal and idler photons. Here, it is desirable to tune the frequency of the outputted signal and select the photons for specific applications. The Frequency Selector for Superconducting Parametric amplifiers allows for the production of frequency tunable entangled photon pairs while preserving the higher power and dynamic range. The addition of a resonator 200 and inverse diplexer 300 after the waveguide of the JTWPA permit a high degree of tunability once the components are not restricted by the design of the waveguide.

A resonator 200 may be electrically connected in series to the JTWPA for receiving and tuning the frequency of the signal ($\omega_s$) and idler frequencies ($\omega_i$) to an application frequency. The resonator 200 is a device or system that exhibits resonant behavior by oscillating at a greater amplitude at their resonant frequency. These devices can tune or adjust input frequencies and are selected by an operator based on the desired output. JTWPAs are typically designed with a certain frequency operation window that may or may not fit with the intended application. Here, the resonator 200 may adjust or tune the signal frequency and idler frequency without adding any noise to the system. Accordingly, this enables a customizable solution for quantum applications requiring specific operational frequencies.

Bandwidth limitations may exist in some embodiments based on components external to the JTWPA 100, resonator 200, and inverse diplexer 300. Circulator components, often used as a microwave circuit component, may impose bandwidth limitations. Similarly, amplifiers may impose bandwidth limitations. The amplification benefits of this disclosed subject matter may be designed to cooperate with these limitations for an intended use case.

In some embodiments, the resonator 200 may tune the signal and idler frequencies for application in frequencies ranges corresponding to uses in microwave quantum illumination. Microwave quantum illumination may include uses such as a non-ionizing instrument for biological imaging. These application may operate at exemplary frequencies between 1 and 11 GHz. For one specific example, at the sum of signal and idler frequencies of 10.09 GHz and 6.8 GHz, respectively. In another embodiment, the subject matter disclosed herein may be applied to any use in the microwave region of the spectrum. As another example, the resonator 200 may tune the signal and idler frequencies for application in frequencies ranges corresponding to uses in microwave quantum radar.

In some embodiments, the resonator 200 may tune the signal and idler frequencies for wireless communications frequencies. For example, the common bandwidths for Wi-Fi standards include 2.4 GHz, 5 GHz, and 6 GHz. These standards are utilized in Internet of Things (IoT) applications, wherein networks of physical object that may connected and exchange data utilize short range transmissions pathways. Common frequency ranges for IoT include 4 GHz to 10 GHz. For example, a 5.8 GHz bandwidth is a communication standard and is an exemplary use case for the frequency tuning and selecting features described herein. Furthermore, this may be applied to entangled IoT applications. In this embodiment, each node may have a cryostat at each to maintain the necessary low temperature for each device in the IoT network.

Additionally, the frequency selector for superconducting parametric amplifiers may tune the signal and idler frequencies for qubit control applications. It is beneficial to control qubits and readout their physical states for quantum computing applications. An outstanding issue in this space is the need for control circuits that do not introduce noise or thermal loads. Accordingly, a frequency selector for superconducting parametric amplifiers may be applied to qubit control.

An inverse diplexer 300 is an apparatus that may separate one incoming signal into two output signals. Conversely, a diplexer may combine two incoming signals into a single output signal. Whether the signals are combined or separated are based on the orientation of the diplexer. Here, the frequency selector for superconducting parametric amplifiers may utilize an inverse diplexer 300 in series with the JTWPA 100 and resonator 200 and be configured to split the entangled photons into a high-pass and low-pass band according to the signal and idler frequencies. According to typical industry conventions, the single frequency goes to the low pass and the idler frequency to the high pass. The inverted diplexer is important because, the signal and idler frequencies are indistinguishable when leaving the JTWPA 100. The inverse diplexer 300 separates the signal and idler particles and makes them distinguishable through LC circuit with certain specifications. Diplexers are constructed to conform to certain specifications for the hi-pass and low-pass bands. Here, the inverse diplexer 300 and its specifications may be chosen by one skilled in the art to fit the requirements for the intended application. In one embodiment, the inverse diplexer may be a cryogenic diplexer 300, which will operate at similar cryogenic temperatures to the JWTPA to minimize additional noise to the signal when separating the signal and idler frequencies.

In one embodiment, a frequency selector for superconducting parametric amplifiers may comprise a Traveling Wave Parametric Amplifier (TWPA), resonator 200, and an inverse diplexer 300. These elements may be connected in series to similarly tune the output frequency and select photon pairs at idler and signal frequencies for specific applications. Again, the resonator 200 may be selected by a skilled practitioner to have tuned the signal and idler frequencies to the specific application's need. Thereafter, the diplexer is selected with specifications that properly separate the entangle photons in the signal and idler frequencies at a high-pass and low-pass bandwidth.

Figure 3:
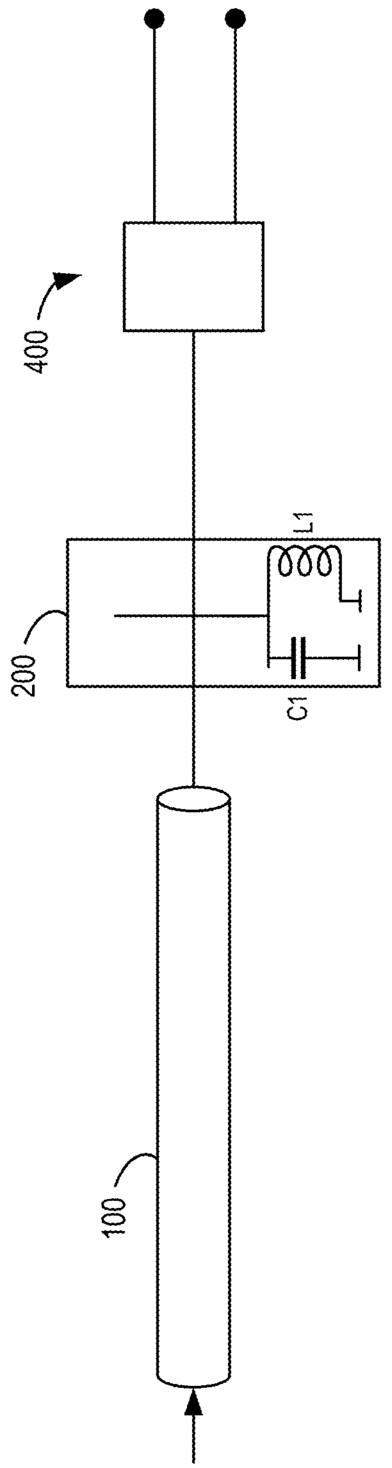
FIG. 3 is an illustration of one embodiment of a frequency selector for superconducting parametric amplifiers comprising a multiplexer.

FIG. 3 is an illustration of one embodiment of a frequency selector for superconducting parametric amplifiers comprising a JTWPA 100 in series with a resonator 200, and an analog demultiplexor 400. While similar to the embodiment shown in FIG. 2, this embodiment is distinguished by a demultiplexor 400. The demultiplexor may be placed in series and subsequent to the resonator 200 to separates the idler and signal frequencies outputted from the JTWPA. Furthermore, the demultiplexor may be cryogenic to operate at the same cryogenic temperatures of the JTWPA will prevent extra noise from being added to the exiting entangled pairs.

A demultiplexor 400 is an apparatus that implements frequency-domain multiplexing. At least one data input (analog or digital) is received by a demultiplexor, which then forwards the data input to a plurality of outputs based on certain selection criteria. Some embodiments of this subject matter may benefit from using a cryogenic demultiplexor. Cryogenic demultiplexors and diplexers are designed using superconducting materials, which will minimize the extra noise added to the exiting entangled pairs from a JTWPA.

Figure 4:
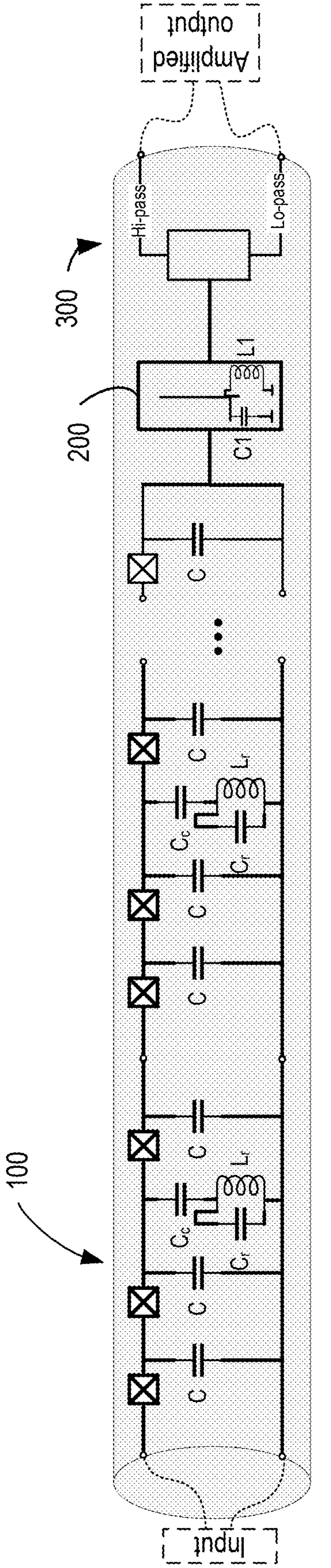
FIG. 4 shows and illustration of a frequency selector for superconducting parametric amplifiers.

FIG. 4 shows and illustration of a frequency selector for superconducting parametric amplifiers comprising a JTWPA electrically coupled to a resonator 200 and a diplexer 300. Here, the resonator 200 and the diplexer 300 may be built on the same chip of the JTWPA. The ellipses indicates a plurality of embodiment wherein the JTWPA further comprises additionally Josephson junctions. Constructing a frequency selector for superconducting parametric amplifiers on a single chip reduce size requirements and improve reliability. As a note, this the resonator 200 and a diplexer 300 are not integrated into the circuitry of the JWTPA, but built within a single chip. Furthermore, C, $C_r$, $C_c$, $L_r$, and $L_l$ may be selected to achieve a desired power gain.

From the above description of Frequency Selector for Superconducting Parametric Amplifiers, it is manifest that various techniques may be used for implementing the concepts of a frequency selector apparatus and system for superconducting parametric amplifiers without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that of a frequency selector apparatus and system for superconducting parametric amplifiers are not limited to the particular embodiments described herein, but is capable of many embodiments without departing from the scope of the claims.

What is claimed:

1. A frequency selector system for superconducting parametric amplifiers, comprising:

a Josephson traveling wave parametric amplifier (JTWPA) for producing entangled photon pairs at signal frequency and idler frequency;

a resonator electrically connected to the JTWPA for tuning the signal frequency and idler frequency to an application frequency; and an inverse diplexer electrically connected to the resonator for separating the signal frequency and the idler frequency.

2. The frequency selector system for superconducting parametric amplifiers of claim 1, wherein the inverse diplexer is cryogenic.

3. The frequency selector system for superconducting parametric amplifiers of claim 1, wherein JTWPA, resonator, and inverse diplexer are coupled to a single circuit board.

4. The frequency selector system for superconducting parametric amplifiers of claim 1, wherein the application frequencies corresponding to uses in microwave quantum illumination.

5. The frequency selector system for superconducting parametric amplifiers of claim 1, wherein the application frequencies corresponding to uses in wireless communications.

6. The frequency selector system for superconducting parametric amplifiers of claim 1, wherein the application frequencies are between 1 GHz and 11 GHz.

7. A frequency selector apparatus for superconducting parametric amplifiers, comprising:

a Josephson traveling wave parametric amplifier (JTWPA) for producing entangled photon pairs at signal frequency and idler frequency;

a resonator electrically connected to the JTWPA for tuning the signal frequency and idler frequency to an application frequency; and an inverse diplexer electrically connected to the resonator for separating the signal frequency and the idler frequency.

8. The frequency selector apparatus for superconducting parametric amplifiers of claim 7, wherein the inverse diplexer is cryogenic.

9. The frequency selector apparatus for superconducting parametric amplifiers of claim 7, wherein JTWPA, resonator, and inverse diplexer are coupled to a single circuit board.

10. The frequency selector apparatus for superconducting parametric amplifiers of claim 7, wherein the application frequencies corresponding to uses in microwave quantum illumination.

11. The frequency selector apparatus for superconducting parametric amplifiers of claim 7, wherein the application frequencies corresponding to uses in wireless communications.

* * * * *